United States Patent
Tawara et al.

(10) Patent No.: US 10,453,924 B2
(45) Date of Patent: Oct. 22, 2019

(54) SILICON CARBIDE SEMICONDUCTOR SUBSTRATE, METHOD OF MANUFACTURING SILICON CARBIDE SEMICONDUCTOR SUBSTRATE, SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Takeshi Tawara, Tsukuba (JP); Hidekazu Tsuchida, Yokosuka (JP); Tetsuya Miyazawa, Yokosuka (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/019,531

(22) Filed: Jun. 26, 2018

(65) Prior Publication Data

US 2018/0323263 A1 Nov. 8, 2018

Related U.S. Application Data

(63) Continuation of application No. PCT/JP2017/027579, filed on Jul. 28, 2017.

(51) Int. Cl.
*H01L 29/16* (2006.01)
*C30B 29/36* (2006.01)
(Continued)

(52) U.S. Cl.
CPC ........ *H01L 29/1608* (2013.01); *C30B 25/183* (2013.01); *C30B 25/20* (2013.01);
(Continued)

(58) Field of Classification Search
None
See application file for complete search history.

(56) References Cited

U.S. PATENT DOCUMENTS

| 5,814,546 A | 9/1998 | Hermansson |
| 2009/0186470 A1 | 7/2009 | Takahashi et al. |

(Continued)

FOREIGN PATENT DOCUMENTS

| JP | H05-021358 A | 1/1993 |
| JP | 2001-502474 A | 2/2001 |

(Continued)

OTHER PUBLICATIONS

J.J. Sumakeris, et al., "Approaches to Stabilizing the Forward Voltage of Bipolar SiC Devices", Materials Science Forum, vol. 457-460, 2004, pp. 1113-1116.

*Primary Examiner* — Michelle Mandala
(74) *Attorney, Agent, or Firm* — Rabin & Berdo, P.C.

(57) ABSTRACT

A silicon carbide semiconductor substrate, including a silicon carbide substrate of a first conductivity type, a buffer layer of the first conductivity type and an epitaxial layer of the first conductivity type. The silicon carbide substrate has a central part and a peripheral part surrounding the central part, and is doped with a first impurity that determines the first conductivity type. The buffer layer is provided on a front surface of the central part of the silicon carbide substrate, and is doped with the first impurity, of which a concentration is at least $1.0 \times 10^{18}/cm^3$, and a second impurity different from the first impurity. The epitaxial layer is provided on a front surface of the peripheral part of the silicon carbide substrate, and is doped with the first impurity, of which a concentration is lower than the concentration of the first impurity in the buffer layer.

4 Claims, 4 Drawing Sheets

(51) Int. Cl.
    *C30B 25/18*     (2006.01)
    *C30B 25/20*     (2006.01)
    *H01L 21/02*     (2006.01)
    *H01L 21/04*     (2006.01)
    *H01L 29/36*     (2006.01)

(52) U.S. Cl.
    CPC ........ *C30B 29/36* (2013.01); *H01L 21/02447* (2013.01); *H01L 21/02494* (2013.01); *H01L 21/02634* (2013.01); *H01L 21/0465* (2013.01); *H01L 29/36* (2013.01); *H01L 21/02378* (2013.01); *H01L 21/02529* (2013.01); *H01L 21/02576* (2013.01)

(56) References Cited

U.S. PATENT DOCUMENTS

| | | |
|---|---|---|
| 2011/0165764 A1 | 7/2011 | Sasaki et al. |
| 2012/0216743 A1 | 8/2012 | Itoh et al. |
| 2012/0241766 A1* | 9/2012 | Ohtsuka ................ C30B 23/02 257/77 |
| 2012/0313139 A1 | 12/2012 | Matsuura et al. |
| 2016/0086798 A1 | 3/2016 | Tanaka et al. |
| 2018/0047630 A1* | 2/2018 | Kato ...................... B23K 26/57 |

FOREIGN PATENT DOCUMENTS

| | | |
|---|---|---|
| JP | 2009-010120 A | 1/2009 |
| JP | 2012-195562 A | 10/2012 |
| JP | 2012-256628 A | 12/2012 |
| JP | 2014-231457 A | 12/2014 |
| WO | WO-2008/120469 A1 | 10/2008 |
| WO | WO-2010/131570 A1 | 11/2010 |

* cited by examiner

LINEAR STACKING FAULT

TRIANGULAR STACKING FAULT

SILICON CARBIDE SEMICONDUCTOR SUBSTRATE, METHOD OF MANUFACTURING SILICON CARBIDE SEMICONDUCTOR SUBSTRATE, SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2017/027579 filed on Jul. 28, 2017, which claims priority from a Japanese Patent Application No. 2016-150853 filed on Jul. 29, 2016, the contents of which are incorporated herein by reference.

BACKGROUND OF THE INVENTION

1. Field of the Invention

Embodiments of the invention relate to a silicon carbide semiconductor substrate, a method of manufacturing a silicon carbide semiconductor substrate, a semiconductor device, and a method of manufacturing a semiconductor device.

2. Description of the Related Art

An epitaxial wafer (silicon carbide semiconductor substrate, hereinafter, simply, substrate) in which silicon carbide (SiC) is epitaxially grown on a substrate has many crystal defects and dislocations, which are believed to adversely affect characteristics of the silicon carbide semiconductor device. In particular, basal plane dislocations (BPDs) in a layer formed by epitaxial growth expand to stacking faults during bipolar operation of the semiconductor device, whereby current flow is hindered and the ON voltage of the semiconductor device increases, leading to "bipolar degradation".

BPDs are present in a substrate at a density of several hundred to several thousand BPDs/cm2. While a majority of the BPDs are converted to threading edge dislocations (TEDs) during epitaxial growth, BPDs remain in the substrate at a density of 1 to 100 BPDs/cm2 after the epitaxial growth. Thus, during bipolar operation of a silicon carbide semiconductor device fabricated (manufactured) using the substrate, when excessive current flows, BPDs in the substrate expand, whereby triangular and bar stacking faults occur.

FIG. 7 is a top view of a conventional silicon carbide semiconductor substrate obtained by photographing the photoluminescence of stacking faults in the conventional silicon carbide semiconductor substrate. FIG. 7 depicts photoluminescence measurement results for the substrate, obtained by removing an anode electrode and at room-temperature, using a bandpass filter of about 420 nm after a p-intrinsic-n (pin) diode formed using the conventional silicon carbide semiconductor substrate is operated for about one hour under bipolar operation at a current density of 600 A/cm$^2$. FIG. 7 depicts a state in which in the substrate, a long bar stacking fault extending from a left edge to a right edge of the substrate and plural triangular stacking faults emit light.

Electron-hole recombination in the substrate is one factor contributing to the occurrence of bar stacking faults and triangular stacking faults. To suppress this recombination, one technique aims to prevent excessive hole injection to the substrate by increasing the thickness of a buffer layer formed by epitaxial growth (hereinafter, epi growth) on a substrate (for example, refer to J. J. Sumakeris, et al, "Approaches to Stabilizing the Forward Voltage of Bipolar SiC Devices", (USA), Materials Science Forum, online Vol. 457-460, 2004, pp. 1113-1116).

According to another technique, a highly doped layer is formed on a surface of a second-conductivity-type charge injection layer of a silicon-carbide bipolar type semiconductor device, and of the electrons (or holes) from the drift layer, electrons (or holes) that are not captured at the injection layer are captured at the highly doped layer, whereby the occurrence of stacking faults and increases in the mathematical area of the stacking faults are suppressed (for example, refer to Japanese Laid-Open Patent Publication No. 2009-010120).

SUMMARY OF THE INVENTION

According to an embodiment of the present invention, a silicon carbide semiconductor substrate includes a silicon carbide substrate of a first conductivity type and having a peripheral part encompassing a predetermined distance from an end of the silicon carbide substrate and a central part excluding the peripheral part; a buffer layer of the first conductivity type provided on a front surface of the central part of the silicon carbide substrate, the buffer layer being introduced with a first impurity that determines a conductivity type of the silicon carbide substrate and a second impurity different from the first impurity, a concentration of the first impurity in the buffer layer being at least $1.0 \times 10^{18}/cm^3$; and an epitaxial layer of the first conductivity type provided on a front surface of the peripheral part of the silicon carbide substrate, a concentration of the first impurity in the epitaxial layer being lower than the concentration of the first impurity in the buffer layer.

In the embodiment, the epitaxial layer is a voltage blocking layer. The voltage blocking layer is further provided on a first side of the buffer layer, opposite a second side of the buffer layer, the second side facing toward the silicon carbide substrate.

In the embodiment, the silicon carbide semiconductor substrate further includes a voltage blocking layer of the first conductivity type provided on a first side of the buffer layer, opposite a second side of the buffer layer facing toward the silicon carbide substrate, the voltage blocking layer being further provided on a first side of the epitaxial layer, opposite a second side of the epitaxial layer facing toward the silicon carbide substrate, a concentration of the first impurity in the voltage blocking layer being lower than the concentration of the first impurity in the buffer layer.

In the embodiment, the predetermined distance is in a range from 0.1 mm to 30 mm.

According to another embodiment of the present invention, a method of manufacturing a silicon carbide semiconductor substrate, includes preparing a silicon carbide substrate of a first conductivity type and having a peripheral part encompassing a predetermined distance from an end of the silicon carbide substrate and a central part excluding the peripheral part; forming a buffer layer of the first conductivity type on a front surface of the central part of the silicon carbide substrate, the buffer layer being introduced with a first impurity that determines a conductivity type of the silicon carbide substrate and a second impurity different from the first impurity, a concentration of the first impurity in the buffer layer being at least $1.0 \times 10^{18}/cm^3$; and forming a voltage blocking layer of the first conductivity type on a front surface of the peripheral part of the silicon carbide substrate and on a first side of the buffer layer, opposite a second side of the buffer layer facing toward the silicon carbide substrate, a concentration of the first impurity in the voltage blocking layer being lower than the concentration of the first impurity in the buffer layer.

In the embodiment, the buffer layer is formed by epitaxial growth, after a cover that covers the peripheral part is placed on a front surface of the silicon carbide substrate.

In the embodiment, the predetermined distance is in a range from 0.1 mm to 30 mm.

According to another embodiment of the present invention, a method of manufacturing a silicon carbide semiconductor substrate, includes preparing a silicon carbide substrate of a first conductivity type and having a peripheral part encompassing a predetermined distance from an end of the silicon carbide substrate and a central part excluding the peripheral part; forming an epitaxial layer of the first conductivity type on a front surface of the silicon carbide substrate, a concentration of a first impurity in the epitaxial layer being lower than a concentration of the first impurity in the silicon carbide substrate, the first impurity determining a conductivity type of the silicon carbide substrate; forming a buffer layer of the first conductivity type in a region of the epitaxial layer, the region opposing the central part of the silicon carbide substrate, the buffer layer being introduced with the first impurity and a second impurity different from the first impurity, a concentration of the first impurity in the buffer layer being at least $1.0 \times 10^{18}/cm^3$; and forming a voltage blocking layer of the first conductivity type on a first side of the epitaxial layer and a first side of the buffer layer, respectively opposite a second side of the epitaxial layer and a second side of the buffer layer, the second sides each facing toward the silicon carbide substrate, a concentration of the first impurity in the voltage blocking layer being lower than the concentration of the first impurity in the buffer layer.

In the embodiment, the buffer layer is formed by ion implantation, after a mask having an opening at a region opposing the central part is formed on the first side of the epitaxial layer.

In the embodiment, the predetermined distance is in a range from 0.1 mm to 30 mm.

According to another embodiment of the present invention, a semiconductor device includes a silicon carbide semiconductor substrate that includes: a silicon carbide substrate of a first conductivity type and having a peripheral part encompassing a predetermined distance from an end of the silicon carbide substrate and a central part excluding the peripheral part; a buffer layer of the first conductivity type provided on a front surface of the central part of the silicon carbide substrate, the buffer layer being introduced with a first impurity that determines a conductivity type of the silicon carbide substrate and a second impurity different from the first impurity, a concentration of the first impurity in the buffer layer being at least $1.0 \times 10^{18}/cm^3$; and an epitaxial layer of the first conductivity type provided on a front surface of the peripheral part of the silicon carbide substrate, a concentration of the first impurity in the epitaxial layer being lower than the concentration of the first impurity in the buffer layer.

According to another embodiment of the present invention, a method of manufacturing a semiconductor device, includes using a silicon carbide semiconductor substrate that includes: a silicon carbide substrate of a first conductivity type and having a peripheral part encompassing a predetermined distance from an end of the silicon carbide substrate and a central part excluding the peripheral part; a buffer layer of the first conductivity type provided on a front surface of the central part of the silicon carbide substrate, the buffer layer being introduced with a first impurity that determines a conductivity type of the silicon carbide substrate and a second impurity different from the first impurity, a concentration of the first impurity in the buffer layer being at least $1.0 \times 10^{18}/cm^3$; and an epitaxial layer of the first conductivity type provided on a front surface of the peripheral part of the silicon carbide substrate, a concentration of the first impurity in the epitaxial layer being lower than the concentration of the first impurity in the buffer layer.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the related arts will be discussed. Deposition of a thick buffer layer leads to increased cost due to reduced throughput for the epi growth, decreased yield due to increases in defect density, and increased substrate resistance. Therefore, a silicon carbide semiconductor substrate capable of effectively suppressing the occurrence of triangular and bar stacking faults in the substrate even with bipolar operation by a large current (hereinafter, stacking-fault suppressing semiconductor substrate) has been proposed in which the thickness of the buffer layer is curbed by depositing a buffer layer having an impurity concentration about equal to or higher than that of the substrate.

Figure 8:
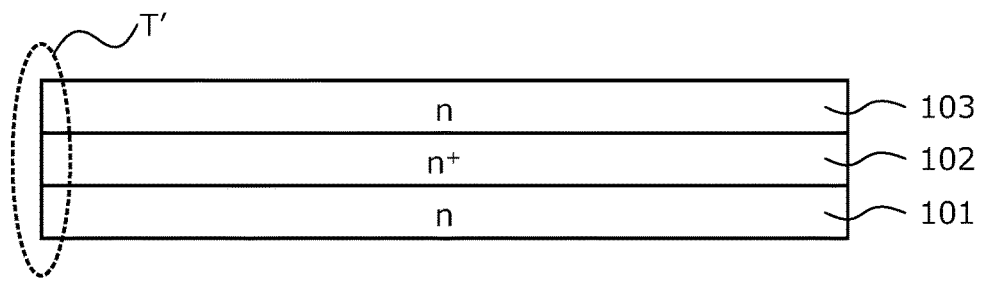
FIG. 8 is a cross-sectional view of a stacking-fault suppressing semiconductor substrate.

FIG. 8 is a cross-sectional view of the stacking-fault suppressing semiconductor substrate. As depicted in FIG. 8, in the stacking-fault suppressing substrate, an n$^+$-type silicon carbide buffer layer 102 is deposited on a first main surface (front surface), for example, a (0001) plane (Si face), of an n-type silicon carbide substrate 101.

The n-type silicon carbide substrate 101 is a silicon carbide single crystal substrate doped with, for example, nitrogen (N). The n+-type silicon carbide buffer layer 102 is a buffer layer in which a lifetime killer is introduced and is further doped with, for example, nitrogen to have an impurity concentration of $1.0 \times 10^{18}/cm^3$ or more. At least one or more of, for example, boron (B), vanadium (V), titanium (Ti), chromium (Cr), iron (Fe), etc. may be selected as the lifetime killer. On a first side of the n+-type silicon carbide buffer layer 102, opposite a second side thereof facing toward the n-type silicon carbide substrate 101, an n-type voltage blocking layer 103 is formed. The n-type voltage blocking layer 103 is a drift layer that is doped with, for example, nitrogen and that has an impurity concentration that is lower than the impurity concentrations of the n-type silicon carbide substrate 101 and the n+-type silicon carbide buffer layer 102.

The stacking-fault suppressing semiconductor substrate promotes electron-hole recombination in the n+-type silicon carbide buffer layer 102 and suppresses the density of holes injected in the n-type silicon carbide substrate 101, thereby effectively suppressing the occurrence of triangular and bar stacking faults.

Here, since silicon carbide is a material in which the diffusion of an impurity is difficult, as a lifetime killer, a material may be selected that does not easily diffuse even at a high temperature such as from about 1600 to 1700 degrees C., the range of the highest temperature in an device manufacturing process. Nonetheless, at a substrate end T' of the stacking-fault suppressing semiconductor substrate, the n+-type silicon carbide buffer layer 102 is exposed. Therefore, a problem arises in that when sacrificial oxidation is performed in the manufacturing process, the lifetime killer diffuses and contaminates the devices to be manufactured.

A problem further arises in that when the n+-type silicon carbide buffer layer 102 doped with a high concentration of nitrogen is deposited at the substrate end T' by epitaxial growth, scratches present at the substrate end T' cause stacking faults to occur and the stacking faults extend toward a center of the substrate.

Embodiments of a silicon carbide semiconductor substrate, a method of manufacturing a silicon carbide semiconductor substrate, a semiconductor device, and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
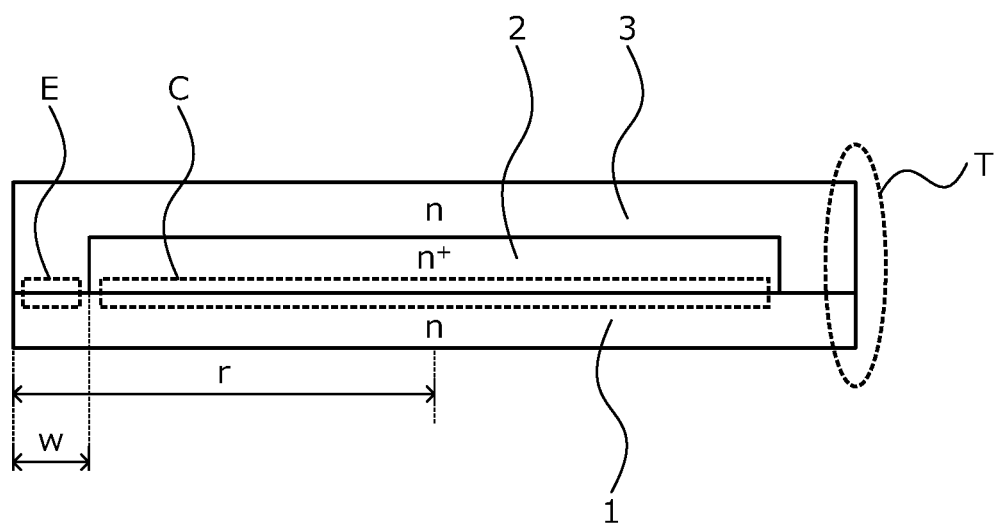
FIG. 1 is a cross-sectional view of a silicon carbide semiconductor substrate according to a first embodiment.

FIG. 1 is a cross-sectional view of the silicon carbide semiconductor substrate according to a first embodiment. As depicted in FIG. 1, in the silicon carbide semiconductor substrate according to the first embodiment, on a first main surface (front surface), for example, a (0001) plane (Si face), of an n-type silicon carbide substrate (silicon carbide substrate of a first conductivity type) 1, an n+-type silicon carbide buffer layer (buffer layer of the first conductivity type) 2 is deposited.

The n-type silicon carbide substrate 1 is a silicon carbide single crystal substrate doped with, for example, nitrogen. The n+-type silicon carbide buffer layer 2 is a buffer layer doped with an impurity, for example, nitrogen, that determines the conductivity type of the n-type silicon carbide substrate 1, and has an impurity concentration higher than that of the n-type silicon carbide substrate 1. Further, in the n+-type silicon carbide buffer layer 2, a lifetime killer is introduced that is an impurity different from the impurity that determines the conductivity type of the n-type silicon carbide substrate 1. At least one or more of, for example, boron, vanadium, titanium, chromium, iron, etc. is introduced as the lifetime killer. Further, the concentration of the lifetime killer is lower than the concentration of the impurity that determines the conductivity type of the n-type silicon carbide substrate 1.

Here, the n-type silicon carbide substrate 1 includes a peripheral part encompassing a predetermined distance w from a substrate end T, and a central part exclusive of the peripheral part. The central part of the n-type silicon carbide substrate 1 is a portion where a chip of the semiconductor device is formed and the peripheral part is a portion where the chip is not formed and that is discarded. Further, the predetermined distance w is in a range, for example, from 0.1 mm to 30 mm.

The n+-type silicon carbide buffer layer 2 is deposited only on a front surface of the central part of the n-type silicon carbide substrate 1. In FIG. 1, the front surface of the central part of the n-type silicon carbide substrate 1 is a part indicated by reference character C, and a front surface of the peripheral part of the n-type silicon carbide substrate 1 is indicated by reference character E.

For example, assuming that the n-type silicon carbide substrate 1 has a circular shape and a radius r, on the front surface of the central part having a radius of r−w from a center of the n-type silicon carbide substrate 1, the n+-type silicon carbide buffer layer 2 is deposited, and on the front surface of the peripheral part from an edge (r−w from the center) of the central part to an edge of the n-type silicon carbide substrate 1, the n+-type silicon carbide buffer layer 2 is not deposited. In this manner, the n+-type silicon carbide buffer layer is deposited only on the front surface of the central part of the n-type silicon carbide substrate 1 and therefore, in the silicon carbide semiconductor substrate of the first embodiment, the n+-type silicon carbide buffer layer 2 is not exposed at the substrate end T.

On a first side of the n+-type silicon carbide buffer layer 2, opposite a second side thereof facing toward the n-type silicon carbide substrate 1 and on the front surface of the peripheral part of the n-type silicon carbide substrate 1, an n-type voltage blocking layer (voltage blocking layer of the first conductivity type) 3 is formed. The n-type voltage blocking layer 3 is a drift layer that is doped with, for example, nitrogen and that has an impurity concentration that is lower than the impurity concentrations of the n-type silicon carbide substrate 1 and the n+-type silicon carbide buffer layer 2.

Here, since the n+-type silicon carbide buffer layer 2 is not provided in the peripheral part of the n-type silicon carbide substrate 1 according to the first embodiment, excessive hole injection to the n-type silicon carbide substrate 1 cannot be prevented and thus, bar stacking faults and triangular stacking faults occur in the n-type silicon carbide substrate 1. However, the bar stacking faults and triangular stacking faults grow upward (in a direction of the n-type voltage blocking layer 3) from the n-type silicon carbide substrate 1 and do not grow toward the central part of the n-type silicon carbide substrate 1. The peripheral part of the n-type silicon carbide substrate 1 is a part that is discarded during semiconductor chip manufacturing and therefore, the occurrence of linear stacking faults and triangular stacking faults is not problematic.

Figure 2:
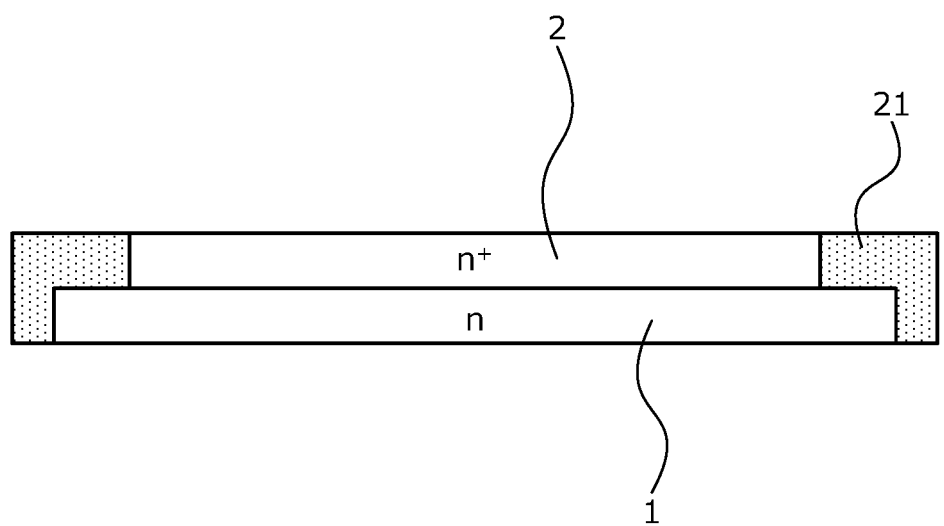
FIG. 2 is a cross-sectional view of the silicon carbide semiconductor substrate according to the first embodiment during manufacture.

A method of manufacturing the silicon carbide semiconductor substrate according to the first embodiment will be described. FIG. 2 is a cross-sectional view of the silicon carbide semiconductor substrate according to the first embodiment during manufacture. First, the n-type silicon carbide substrate 1 containing an n-type silicon carbide is prepared. The n-type silicon carbide substrate 1 is a silicon carbide single crystal substrate having an impurity concentration of, for example, $5 \times 10^{18}/cm^3$. Subsequently, on the front surface of the n-type silicon carbide substrate 1, a cover 21 is placed, covering the front surface of the peripheral part of the n-type silicon carbide substrate 1. At this time, the cover 21 is placed so that no gap occurs between the n-type silicon carbide substrate 1 and the cover 21.

Figure 3A:
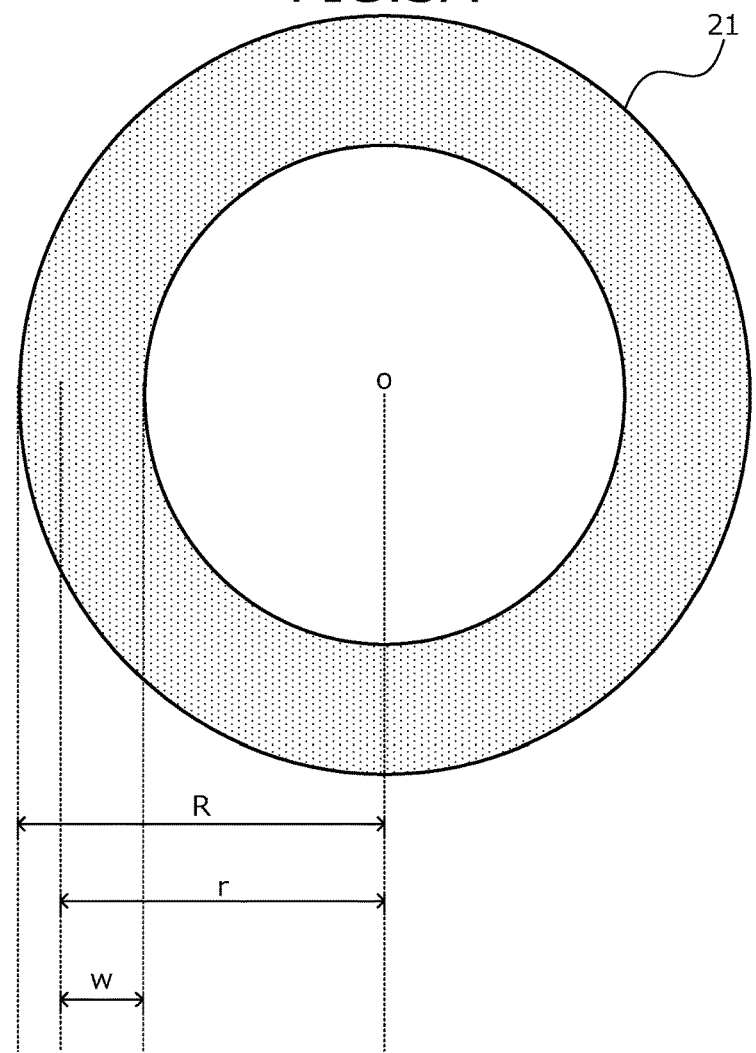
FIG. 3A is a top view of a cover used in the manufacture of the silicon carbide semiconductor substrate according to the first embodiment.
Figure 3B:
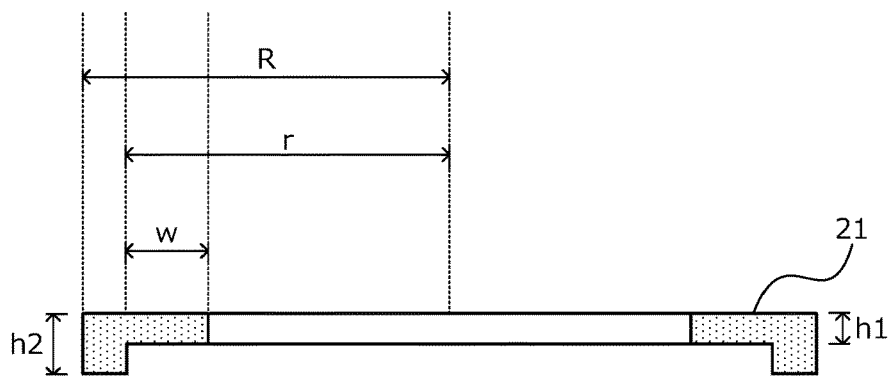
FIG. 3B is a cross-sectional view of the cover used in the manufacture of the silicon carbide semiconductor substrate according to the first embodiment.

FIGS. 3A and 3B are views of the cover used in the manufacture of the silicon carbide semiconductor substrate according to the first embodiment. FIG. 3A is a top view of the cover 21. As depicted in FIG. 3A, the cover 21 has a cutout circular central part. A radius of the cover 21 is R, where R>r (r=radius of the n-type silicon carbide substrate 1) so that the cover 21 covers the peripheral part of the n-type silicon carbide substrate 1. Further, a radius of the cutout circular central part is r−w. Therefore, when the cover 21 is placed with a center o of the cover 21 aligned with the center of the n-type silicon carbide substrate 1, the front surface of the peripheral part of the n-type silicon carbide substrate 1 is covered by the cover 21.

FIG. 3B is a cross-sectional view of the cover 21. As depicted in FIG. 3B, in the cover 21, at a first part that is from a first position that is a distance of r−w from the center o to a second position that is a distance r from the center o, and at a second part that is from the second position to an edge of the cover 21, a thickness of the cover 21 differs. Assuming the thickness at the first part is h1 and the thickness at the second part is h2, then, h1<h2. Further, the thickness h1 is greater than a thickness of the n+-type silicon carbide buffer layer 2 and the thickness h2 is greater than a thickness of the n-type silicon carbide substrate 1. Therefore, when the cover 21 is placed with the center o of the cover 21 aligned with the center of the n-type silicon carbide substrate 1, the substrate end T of the n-type silicon carbide substrate 1 is covered by the cover 21.

Here, the cover 21 is made of, for example, silicon carbide, graphite (C), tantalum carbide (TaC), etc. Further, the cover 21 may be used in a similar manner as a cover for placing a non-depicted silicon carbide semiconductor substrate and may be used any number of times.

On the front surface of the n-type silicon carbide substrate 1, the n+-type silicon carbide buffer layer 2 is formed by epitaxial growth to have a thickness of, for example, about 2 μm, while an n-type impurity, for example, nitrogen atoms, and a lifetime killer are doped. The front surface of the peripheral part of the n-type silicon carbide substrate 1 is covered by the cover 21 and therefore, epitaxial growth occurs only on the front surface of the central part of the n-type silicon carbide substrate 1 and the n+-type silicon carbide buffer layer 2 is formed only on the front surface of the central part of the n-type silicon carbide substrate 1.

The doping of the n-type impurity and the doping of the lifetime killer may be performed simultaneously, or the doping of the lifetime killer may be slightly delayed relative to the doping of the n-type impurity. Conditions of the epitaxial growth for forming the n+-type silicon carbide buffer layer 2 may be set so that, for example, an impurity concentration of the n-type impurity becomes at least $1 \times 10^{18}/cm^3$. The state up to here is depicted in FIG. 2.

Next, the cover 21 is removed from the n-type silicon carbide substrate 1, and on the front surface of the peripheral part of the n-type silicon carbide substrate 1 and on the n+-type silicon carbide buffer layer 2, the n-type voltage blocking layer 3 is formed by epitaxial growth to have a thickness of, for example, about 10 μm, while an n-type impurity, for example, nitrogen atoms, is doped. Conditions of the epitaxial growth for forming the n-type voltage blocking layer 3 may be set so that, for example, an impurity concentration thereof becomes at least $1 \times 10^{16}/cm^3$. Thus, the silicon carbide semiconductor substrate depicted in FIG. 1 is completed.

As described, according to the first embodiment, the end of the n+-type silicon carbide buffer layer, which has a lifetime killer, is covered by the n-type voltage blocking layer and thus, is not exposed. Further, since silicon carbide is a material in which the diffusion of an impurity is difficult and the buffer layer having the lifetime killer is completely covered by the n-type voltage blocking layer, diffusion of the lifetime killer during the manufacturing process may be prevented. Further, according to the first embodiment, the n+-type silicon carbide buffer layer, which as a high impurity concentration, is not in contact with the substrate end and therefore, during epitaxial growth, the occurrence of stacking faults from scratches present at the substrate end may be prevented.

Further, according to the first embodiment, after the cover that covers the peripheral part of the n-type silicon carbide substrate is placed on the n-type silicon carbide substrate, the n+-type silicon carbide buffer layer may be formed at the central part of the n-type silicon carbide substrate by epitaxial growth.

Further, according to the first embodiment, a width of the peripheral part of the n-type silicon carbide substrate is at least 0.1 mm, enabling the effects of scratches at the end of the silicon carbide semiconductor substrate to be prevented. Further, the width of the peripheral part of the n-type silicon carbide substrate is 30 mm or less, enabling decreases in the usable area at the time of semiconductor chip manufacturing to be prevented.

Figure 4:
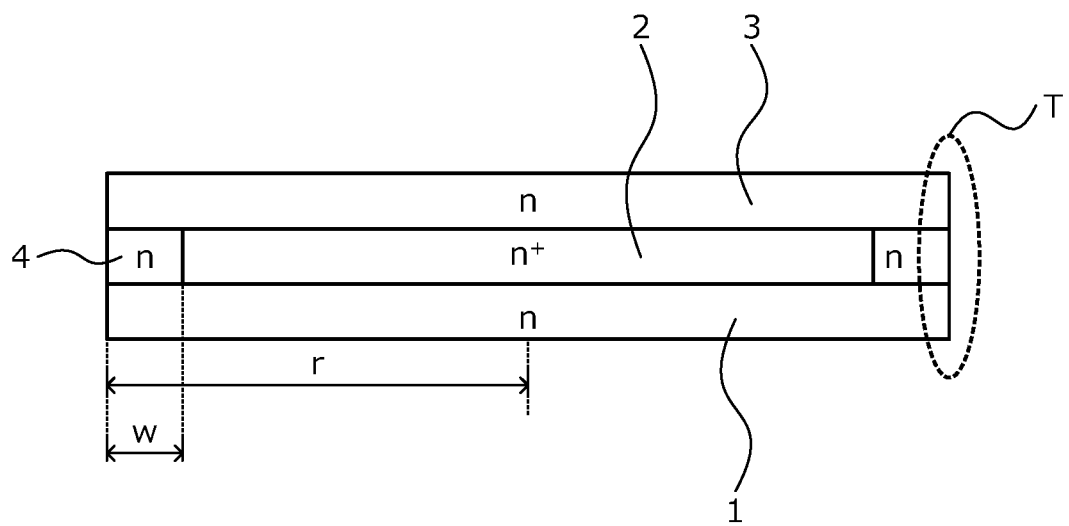
FIG. 4 is a cross-sectional view of the silicon carbide semiconductor substrate according to a second embodiment.

FIG. 4 is a cross-sectional view of the silicon carbide semiconductor substrate according to a second embodiment. As depicted in FIG. 4, in the silicon carbide semiconductor substrate according to the second embodiment, the n+-type silicon carbide buffer layer 2 and an n-type silicon carbide epitaxial layer (epitaxial layer of the first conductivity type) 4 are deposited on the first main surface, for example, a (0001) plane, of the n-type silicon carbide substrate 1.

The n+-type silicon carbide buffer layer 2 is deposited only on the front surface of the central part of the n-type silicon carbide substrate 1 and the n-type silicon carbide epitaxial layer 4 is deposited only on the front surface of the peripheral part of the n-type silicon carbide substrate 1. Further, the n-type silicon carbide epitaxial layer 4 is a buffer layer doped with the impurity, for example, nitrogen, that determines the conductivity type of the n-type silicon carbide substrate 1, and has an impurity concentration lower than that of the n-type silicon carbide substrate 1. Further, no lifetime killer is introduced in the n-type silicon carbide epitaxial layer 4.

On the first side of the $n^+$-type silicon carbide buffer layer and on a first side of the n-type silicon carbide epitaxial layer 4, opposite a second side of the n-type silicon carbide epitaxial layer 4 facing toward the n-type silicon carbide substrate 1, the n-type voltage blocking layer 3 is formed.

Other aspects of the structure of the silicon carbide semiconductor device according to the second embodiment are similar to those of the silicon carbide semiconductor device according to the first embodiment and therefore, description thereof is omitted hereinafter.

Figure 5:
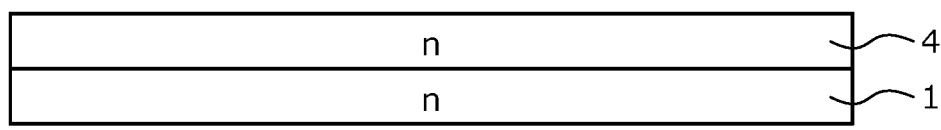
FIG. 5 is a cross-sectional view of the silicon carbide semiconductor substrate according to the second embodiment during manufacture.
Figure 6:
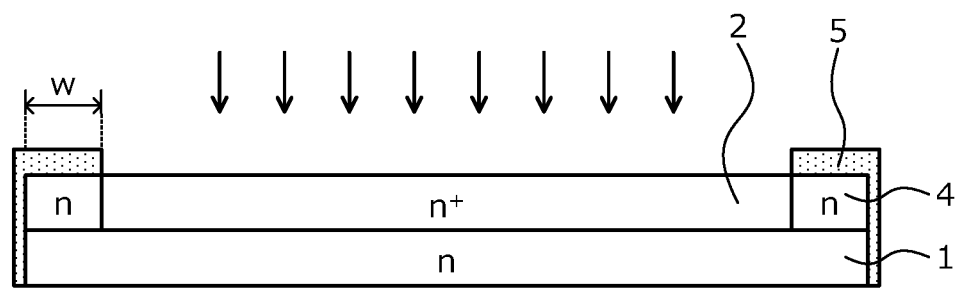
FIG. 6 is a cross-sectional view of the silicon carbide semiconductor substrate according to the second embodiment during manufacture.
Figure 7:
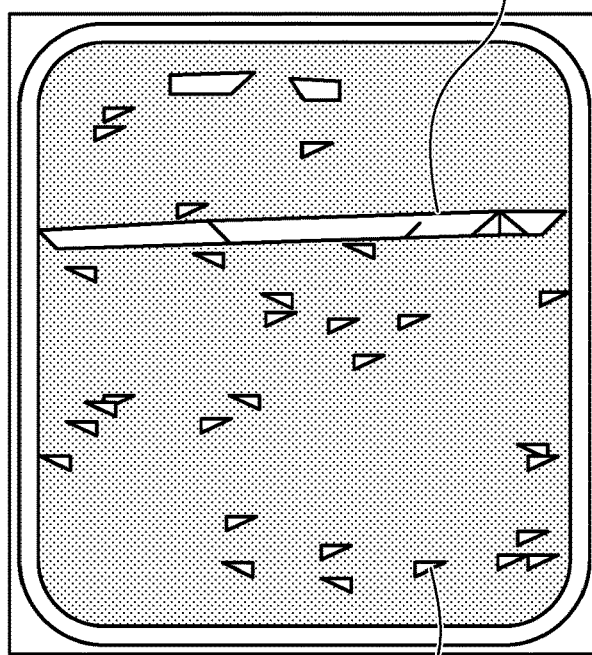
FIG. 7 is a top view of a conventional silicon carbide semiconductor substrate obtained by photographing photoluminescence of stacking faults in the conventional silicon carbide semiconductor substrate.

A method of manufacturing the silicon carbide semiconductor substrate according to the second embodiment will be described. FIGS. 5 and 6 are cross-sectional views of the silicon carbide semiconductor substrate according to the second embodiment during manufacture. First, the n-type silicon carbide substrate 1 containing an n-type silicon carbide is prepared. On the front surface of the n-type silicon carbide substrate 1, the n-type silicon carbide epitaxial layer 4 is formed by epitaxial growth to have a thickness of, for example, about 2 μm, while an n-type impurity, for example, nitrogen atoms, is doped. Conditions of the epitaxial growth for forming the n-type silicon carbide epitaxial layer 4 may be set so that, for example, an impurity concentration thereof is in a range from about $1\times10^{15}/cm^3$ to $1\times10^{18}/cm^3$. The state up to here is depicted in FIG. 5.

Next, on a surface of the n-type silicon carbide epitaxial layer 4, by a photolithographic technique, a mask 5 having an opening at a part opposing the central part of the n-type silicon carbide substrate 1 is formed using, for example, an oxide film, the mask 5 being formed at a part opposing the front surface of the peripheral part of the n-type silicon carbide substrate 1. A width of the mask 5 is w or greater. Further, the mask 5 may cover the substrate end T of the n-type silicon carbide substrate 1. Subsequently, ion implantation is performed using the oxide film as a mask, whereby an n-type impurity, for example, nitrogen, and a lifetime killer are ion implanted. Further, on the front surface of the central part of the n-type silicon carbide substrate 1, the $n^+$-type silicon carbide buffer layer 2 is formed having a thickness of, for example, about 2 μm. Therefore, in the silicon carbide semiconductor substrate of the second embodiment, the $n^+$-type silicon carbide buffer layer 2 is not exposed at the substrate end T. A dose amount at the time of the ion implantation for forming the $n^+$-type silicon carbide buffer layer 2 may be set so that, for example, an impurity concentration thereof becomes at least $1\times10^{18}/cm^3$. Further, a depth of the ion implantation is at most equal to a thickness of the $n^+$-type silicon carbide buffer layer 2. The state up to here is depicted in FIG. 6.

The mask 5 is removed, heat treatment (annealing) is performed, for example, activating the $n^+$-type silicon carbide buffer layer 2. A temperature of the heat treatment may be in a range, for example, from about 1600 degrees C. to 1700 degrees C. A period of the heat treatment may be, for example, about 2 minutes.

Next, on the $n^+$-type silicon carbide buffer layer 2 and on the n-type silicon carbide epitaxial layer 4, the n-type voltage blocking layer 3 is formed by epitaxial growth to have a thickness of, for example, about 10 μm, while an n-type impurity, for example, nitrogen atoms, is doped. Conditions of the epitaxial growth for forming the n-type voltage blocking layer 3 may be set so that, for example, an impurity concentration thereof becomes at least $1\times10^{16}/cm^3$. Thus, the silicon carbide semiconductor substrate depicted in FIG. 4 is completed.

As described, according to the second embodiment, effects similar to those of the first embodiment are achieved. Further, according to the second embodiment, a mask having an opening at the central part of the n-type silicon carbide substrate is formed on the n-type silicon carbide epitaxial layer, whereby the $n^+$-type silicon carbide buffer layer may be formed by ion implantation on the front surface of the central part of the n-type silicon carbide substrate.

Further, while description has been given for a case where the $n^+$-type silicon carbide buffer layer is provided on the front surface of the silicon carbide substrate, the present invention is further applicable in cases where the $n^+$-type silicon carbide buffer layer is provided on a rear surface or the silicon carbide substrate, or on both the front surface and the rear surface of the silicon carbide substrate.

In the embodiments, as an example, a case has been described where the first main surface of the substrate containing silicon carbide is a (0001) plane and on the (0001) plane, the buffer layer is provided. However, without limitation hereto, various changes are possible such as in the type of wide bandgap semiconductor material (a semiconductor material having a bandgap wider than that of silicon, such as gallium nitride (GaN)), orientation of the substrate main surface, etc. Further, in the embodiments of the present invention, while the first conductivity type is assumed to be an n-type and a second conductivity type is assumed to be a p-type, the present invention is similarly implemented when the first conductivity type is a p-type and the second conductivity type is an n-type.

According to the embodiments of the present invention, the end of the n+-type silicon carbide buffer layer in which a lifetime killer is introduced is covered by an n-type voltage blocking layer and thus, not exposed. Since silicon carbide is a material in which the diffusion of an impurity is difficult and the end is covered, diffusion of the lifetime killer during the manufacturing process may be prevented. Further, as described, the n+-type silicon carbide buffer layer, which has a high impurity concentration, is not in contact with the substrate end and therefore, during epitaxial growth, the occurrence of stacking faults from scratches present at the substrate end may be prevented.

Further, according to the embodiments of the present invention, the width of the peripheral part of the n-type silicon carbide substrate is 0.1 mm or greater, enabling the effects of scratches at the end of silicon carbide semiconductor substrate to be prevented. Further, the width of the peripheral part of the n-type silicon carbide substrate is 30 mm or less, enabling decreases in the usable area at the time of semiconductor chip manufacturing to be prevented.

The silicon carbide semiconductor substrate, the method of manufacturing a silicon carbide semiconductor substrate, the semiconductor device and the method of manufacturing a semiconductor device according to the embodiments of the invention achieve an effect in that when a buffer layer having a high impurity concentration of at least $1.0\times10^{18}/cm^3$ and in which a lifetime killer is introduced is deposited on a substrate, diffusion of the lifetime killer during the manufacturing process and the occurrence of stacking faults from the substrate end may be prevented.

As described, the silicon carbide semiconductor substrate, the method of manufacturing a silicon carbide semiconductor substrate, the semiconductor device and the method of manufacturing a semiconductor device according to the embodiments of the present invention are useful for a semiconductor substrate of a high-voltage semiconductor device used in power converting equipment and power supply devices such as in industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor substrate comprising:
   a silicon carbide substrate of a first conductivity type, the silicon carbide substrate having a central part and a peripheral part surrounding the central part, and being doped with a first impurity that determines the first conductivity type;
   a buffer layer of the first conductivity type, the buffer layer being provided on a front surface of the central part of the silicon carbide substrate, and being doped with the first impurity, of which a concentration is at least $1.0 \times 10^{18}/cm^3$, and a second impurity different from the first impurity; and
   an epitaxial layer of the first conductivity type, the epitaxial layer being provided on a front surface of the peripheral part of the silicon carbide substrate, and being doped with the first impurity, of which a concentration is lower than the concentration of the first impurity in the buffer layer.

2. The silicon carbide semiconductor substrate according to claim 1, wherein
   the buffer layer has a first side and a second side opposite to each other, the second side facing the silicon carbide substrate,
   the epitaxial layer is a voltage blocking layer, and
   the voltage blocking layer is further provided on the first side of the buffer layer.

3. The silicon carbide semiconductor substrate according to claim 1, wherein
   each of the buffer layer and the epitaxial layer has a first side and a second side opposite to each other, the second side of the buffer layer and the second side of the epitaxial layer both facing the silicon carbide substrate, and
   the silicon carbide semiconductor substrate further includes a voltage blocking layer of the first conductivity type provided on the first side of the buffer layer and on the first side of the epitaxial layer, the voltage blocking layer being doped with the first impurity, of which a concentration is lower than the concentration of the first impurity in the buffer layer.

4. The silicon carbide semiconductor substrate according to claim 1, wherein
   a distance between an end of the silicon carbide substrate and an interface at which the central part connects the peripheral part is in a range from 0.1 mm to 30 mm.

* * * * *